United States Patent [19]
Shibuya et al.

[11] Patent Number: 6,020,093
[45] Date of Patent: Feb. 1, 2000

[54] PHOTOSENSITIVE COMPOUNDS, PHOTOSENSITIVE RESIN COMPOSITIONS, AND PATTERN FORMATION METHOD MAKING USE OF THE COMPOUNDS OR COMPOSITIONS

[75] Inventors: Toru Shibuya, Matsudo; Jian Rong Xie; Noriaki Tochizawa, both of Funabashi, all of Japan

[73] Assignee: Toyo Gosei Kogyo, Ltd., Chiba, Japan

[21] Appl. No.: 09/078,315

[22] Filed: May 13, 1998

[51] Int. Cl.[7] ................................ G03F 9/00; G03F 7/012
[52] U.S. Cl. .................................. 430/7; 430/23; 430/28; 430/167; 430/195; 430/196; 430/197; 430/325; 552/1; 552/8
[58] Field of Search ........................ 430/195, 196, 430/197, 167, 325, 28, 23, 7; 552/1, 8

[56] References Cited

U.S. PATENT DOCUMENTS

| | | | |
|---|---|---|---|
| 4,065,524 | 12/1977 | Laridon et al. | 260/895 |
| 4,241,162 | 12/1980 | Hatano et al. | 430/195 |
| 4,356,247 | 10/1982 | Aotani et al. | 430/195 |
| 4,792,516 | 12/1988 | Oriumi et al. | 430/196 |
| 4,857,428 | 8/1989 | Koike | 430/25 |
| 5,807,657 | 9/1998 | Kikuchi et al. | 430/287.1 |
| 5,866,296 | 2/1999 | Shibuya et al. | 430/195 |

FOREIGN PATENT DOCUMENTS

| | | |
|---|---|---|
| 48/90185 | 11/1973 | Japan . |
| 48/97602 | 12/1973 | Japan . |
| 48/97603 | 12/1973 | Japan . |
| 48/98905 | 12/1973 | Japan . |
| 49/102404 | 9/1974 | Japan . |
| 50/33764 | 4/1975 | Japan . |
| 50/141403 | 11/1975 | Japan . |
| 55/23163 | 2/1980 | Japan . |
| 55/62905 | 5/1980 | Japan . |
| 56/11906 | 2/1981 | Japan . |
| 2/204750 | 8/1990 | Japan . |
| 4/26849 | 1/1992 | Japan . |
| 5/11442 | 1/1993 | Japan . |
| 5/113661 | 5/1993 | Japan . |
| 5/266795 | 10/1993 | Japan . |
| 6/239930 | 8/1994 | Japan . |
| 8/87962 | 4/1996 | Japan . |
| 8/185799 | 7/1996 | Japan . |

OTHER PUBLICATIONS

Database WP,I Section Ch. Week 9038, Derwent Publications Ltd. London, GB, Class A89, AN90–287901, JP 02 204 750.

Database WPI, Section Ch. Week 8473, Derwent Publications Ltd. London, GB, Class A89, An287–304344, JP 62 215 606.

*Primary Examiner*—John S. Chu
*Attorney, Agent, or Firm*—Huntley & Associates

[57] ABSTRACT

The photosensitive compound of the present invention contains the following unit:

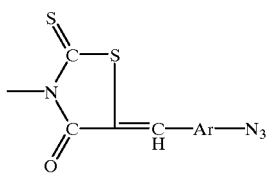

and is particularly expressed by the following formula:

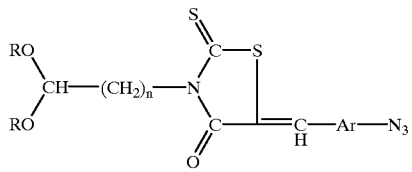

Different photosensitive resin compositions can be prepared from this novel photosensitive resin compound, and the resulting photosensitive resin compositions do not raise the problem of environmental pollution, exhibit high resolution, possess a high level of sensitivity, and exhibit excellent adhesion with substrates, coating characteristics and storage stability.

19 Claims, 1 Drawing Sheet

FIG. 1

○ Photosensitive Liquid A
● Photosensitive Liquid B

PHOTOSENSITIVE COMPOUNDS, PHOTOSENSITIVE RESIN COMPOSITIONS, AND PATTERN FORMATION METHOD MAKING USE OF THE COMPOUNDS OR COMPOSITIONS

BACKGROUND OF THE INVENTION

1. Field of the Invention

The present invention relates to novel photosensitive compounds and photosensitive resin compositions, as well as to a pattern formation method making use of such photosensitive compounds or resin compositions. The photosensitive compounds and photosensitive resin compositions exhibit not only high sensitivity and excellent storage stability, but also provide improved resolution. Thus, they have a wide range of utility, including, color cathode-ray tubes and other display tubes, screen printing, immobilized enzymes, PS (presensitized) plates and etching resists.

2. Description of the Related Art

Conventionally, negative-type photoresists used for the formation of black matrix and phosphor patterns of color cathode-ray tubes have made use of resists composed of a water-soluble polymer (such as polyvinyl alcohol) and a bichromate salt (hereinafter, resists of this type will be referred to as PVA-ADC-based resists). These negative-type photoresists have a fundamental disadvantage in that they require a special treatment facility for preventing environmental pollution, which is caused by the presence of bichromate salts.

To overcome the problem of environmental pollution, it has previously been considered to use compositions containing a water-soluble diazide compound (e.g., sodium 4,4'-diazidostilbene-2,2'-disulfonate (hereinafter abbreviated DAS) which serves as a photocrosslinking agent and a water-soluble polymer that is photocrosslinkable in the presence of the water-soluble diazide compound. Among such known photosensitive compositions are those containing, as photocrosslinkable water-soluble polymers, vinyl alcohol-maleic acid copolymers or salts thereof (Japanese Patent Application Laid-Open (kokai) No. 48-97602), vinyl alcohol-acrylamide copolymers (Japanese Patent Application Laid-Open (kokai) No. 48-97603), or water-soluble polyvinyl butyral (Japanese Patent Application Laid-Open (kokai) No. 48-98905). In practice, however, these compositions cannot be used because of their low sensitivity. Known compositions having sufficient sensitivity have been explored, including those containing polyvinylpyrrolidone (hereinafter abbreviated PVP) and a water-soluble bisazide compound serving as an additive (hereinafter, compositions of this type will be referred to as PVP-DAS-based resists; see, for example, Japanese Patent Application Laid-Open (kokai) No. 48-90185) and those containing an acrylamide-diacetoneacrylamide copolymer (hereinafter abbreviated PAD) and water-soluble bisazide serving as an additive (hereinafter, compositions of this type will be referred to as PAD-DAS-based resists; see, for example, Japanese Patent Application Laid-Open (kokai) No. 50-33764).

PVA-ADC-based resists, when used for the formation of black matrix of color cathode-ray tubes, present a drawback of poor resolution, in addition to the aforementioned problem of environmental pollution, due to low oxygen permeability and lack of reciprocity-law failure characteristics. In contrast, when PVP-DAS-based resists are used, due to their excessively high oxygen permeability, proper sensitivity cannot be obtained unless the thickness of coating film is increased, which in turn reduces resolution. On the other hand, PAD-DAS-based resists exhibit excellent sensitivity and resolution, but after they have undergone formation of resist patterns and coating of graphite, they provide poor etching characteristics, and, depending on the type of graphite, etching cannot be effected.

Regarding use for the formation of phosphor patterns, PVA-ADC-based resists are unsatisfactory in terms of both environmental pollution and sensitivity. In addition, chromium oxide, which remains after firing, degrades luminance of the phosphor. In this regard, both PVP-DAS-based resists and PAD-DAS-based resists have drawbacks in terms of sensitivity and therefore cannot be used.

Japanese Patent Application Laid-Open (kokai) Nos. 55-23163, 55-62905 and 56-11906 disclose non-chromium resists which are used for the formation of phosphor patterns and contain, as a photosensitive unit, a photosensitive resin resulting from a condensation reaction between polyvinyl alcohol and a quaternary ammonium salt (e.g., a styrylpyridinium salt or a styrylquinolinium salt) (hereinafter, resists of this type are referred to as PVA-SbQ-based resists).

Although these PVA-SbQ-based resists exhibit advantages such as shorter time required for photosensitization, they are not necessarily satisfactory in terms of resolution. Moreover, since their ionicity is limited to cationic, use and compositions of the resists are also limited. Furthermore, since a mercury lamp (365 nm) and a metal halide light source (400 nm) are used as light sources for exposure, 4-methylquinoline or a similar substance must be used to set the photosensitive wavelength of the resists in a longer wavelength range. This is adds the drawback of increased costs.

Methods for the formation of color filters for use with color cathode-ray tubes are disclosed in, Japanese Patent Application Laid-Open (kokai) Nos. 5-266795, 8-87962, 8-185799 and others. All of these methods employ dichromate salts as crosslinking agents, and therefore are not completely satisfactory in view of disadvantages such as environmental pollution, low sensitivity and intricate processing.

As described above, there are no conventional photoresists that simultaneously satisfy the requirements of environmental pollution, sensitivity and resolution. Therefore, in certain uses, such as color cathode-ray tubes, other display tubes and screen printing, there is still a need for resists that exhibit excellent sensitivity at a wavelength as long as 400 nm and that are dissolvable or dispersible in an aqueous solvent. Particularly, in consideration of the excellent characteristics of polyvinyl alcohol (hereinafter abbreviated PVA) in use for the formation of phosphor patterns, a demand exists for PVA-based resists of a certain type which have a longer photosensitive wavelength than the wavelength possessed by PVA-SbQ-based resists, and in addition, permit selection between anionic and nonionic depending on their use.

Also, there exists a need for a pattern formation method making use of a composition which exhibits high sensitivity, improved adhesion to a substrate, excellent coating characteristics and stability during storage. There exists a Particularly, there is a need for a pattern formation method in which an advantage related to reciprocity-law failure characteristics, which can be obtained when a water-soluble polymer and a water-soluble azide compound is used in combination, is maintained, and that makes use of a photosensitive composition which exhibits high sensitivity, has improved adhesion characteristics to a substrate, exhibits excellent coating characteristics and stability during storage.

SUMMARY OF THE INVENTION

The present invention provides a photosensitive compound capable of providing novel photosensitive resins, and photosensitive resins prepared from such a compound. Additionally, the present invention provides a pattern formation method making use of a photosensitive resin composition that does not contribute significantly to pollution, exhibits high resolution and improved sensitivity, and exhibits excellent adhesion to substrates, coating characteristics and storage stability.

Specifically, the photosensitive compounds of the present invention comprise at least one unit represented by the following formula (I):

wherein Q is an organic moiety and Ar is selected from at least one of the following group (II):

and wherein X is selected from at least one of lithium, sodium, potassium, ammonium, monoalkylammonium, dialkylammonium, trialkylammonium and tetraalkylammonium.

In a preferred embodiment of the present invention, Q is represented by the following formula (III):

wherein R is selected from among C1–C6 alkyl groups and groups formed of two R's joined to each other, i.e., $(CH_2)_m$—, (m is 2 or 3); n is 1, 2 or 3.

In another preferred embodiment of the present invention, Q is represented by the following formula (IV):

wherein n is 1, 2 or 3 and Ar has the same meaning as described above.

The above-described photosensitive resin composition contains the aforementioned photosensitive resin of the present invention.

Further, a method for the manufacture of photosensitive compound of the present invention is directed to the production of an azide-group-containing photosensitive compound and comprises bringing together, under reaction conditions:

wherein Rz represents hydrogen or a substituent and Ar has the same meaning as described above.

The above-described Rz is a substituent containing, for example, an acetal group.

The method for the manufacture of the photosensitive resin of the present invention is directed to the production of an azide-group-containing photosensitive resin and comprises a reaction step represented by the above-described formula (V).

Rz and Ar have the same meanings as described above.

In the case in which the above-described Rz is a substituent containing, for example, an acetal group, the method for the manufacture of the photosensitive resin of the present invention can further comprise a step including reaction of the acetal group to form a saponified product of polyvinyl acetate.

DETAILED DESCRIPTION OF THE INVENTION

The present invention is based on the discovery that condensation of a rhodanine compound having a variety of substituents (such as an acetal group) and a water-soluble aldehyde having an azide group or an aldehyde having an aromatic ring containing an azide group provides an azide compound having a new rhodanine skeleton.

A novel compound which has a new rhodanine skeleton and can be photosensitized at a long wavelength is provided through condensation of a rhodanine compound having an acetal group and an aromatic aldehyde having an azide group.

A photosensitive resin having a rhodanine skeleton is disclosed in U.S. Pat. No. 2,828,087. However, the photosensitive resin of the present invention is different from the above-disclosed photosensitive compound in terms of the photosensitization mechanism. That is, the photosensitive resin of the present invention is cured through formation of nitrene through decomposition of a light-absorbed azide group and crosslinking reaction induced by coupling of the formed nitrenes and abstraction of hydrogen. The photosensitive resin of the present invention is completely different from those described in the above U.S. patent.

The photosensitive compound or photosensitive resin of the present invention has a unit represented by the above-described formula (I). It exhibits photosensitivity of the azide type, is photosensitizable at a long wavelength, and has excellent stability. A variety of photosensitive compounds or resins can be designed relatively easily through introduction of the unit.

The compound of the present invention having a unit of the above-described formula (I) can be obtained through condensation of a variety of rhodanine compounds, and an azide-group-containing derivative of benzaldehyde or arylaldehyde or an aldehyde compound having an aromatic ring containing an azide group.

A rhodanine compound which can be used in the present invention is represented by the following formula (1):

(1)

wherein Rz represents hydrogen or a substituent, a reactive group for bonding to a variety of resins. When Rz is hydrogen, a variety of substituents can be introduced after condensation reaction with, for example, benzaldehyde having the above-described azide group.

Typical examples of the rhodanine compound include a compound in which Rz is a substituent having an acetal group, and such a rhodanine compound is represented by the following formula (2):

(2)

The rhodanine compound can be obtained through, for example, reaction of an acetal compound having an amino group with carbon disulfide in the presence of a base such as ammonia, triethylamine, NaOH, or KOH to thereby obtain dithiocarbamate, and further reaction of dithiocarbamate with ethyl chloroacetate. No particular limitation is imposed on the reaction solvent, and water, an ether or DMF can be selected for use depending on the amine compound to be used.

An aromatic aldehyde compound having an azide group, or an aldehyde compound having an aromatic ring containing an azide group, which can be condensed with the rhodanine compound, is represented by the following formula (3):

OHC—Ar—N$_3$ (3)

wherein Ar has the same meaning as previously described.

These compounds impart, as needed for the particular application, water-solubility to the photosensitive compound of the present invention, and for such a purpose, water-soluble compounds are used.

The photosensitive compound represented by formula (III) is obtained through use of the rhodanine compound represented by the above-described formula (2). Further, the photosensitive compound can be transformed into the photosensitive resin of the present invention of the above-described formula (IV) through reaction in the presence of an acid catalyst with a saponified product of polyvinyl acetate, or with a water-soluble copolymer of vinyl alcohol and another vinyl compound.

Preferably, the saponified product of polyvinyl acetate has an average polymerization degree of about from 200 to 5,000 and a saponification degree of about from 60 to 100%. Examples of the saponified product of polyvinyl acetate which can be used, include a saponified product of polyvinyl acetate modified with a hydrophilic group, an anion, a cation, or a reactive group such as an acetoacetyl group.

When the average polymerization degree is less than about 200, obtaining the sufficient sensitivity is difficult, whereas when it is in excess of about 5,000, the viscosity of a solution of the photosensitive resin increases, often resulting in poor coating characteristics. Furthermore, when the concentration is decreased in order to reduce the viscosity, obtaining the desired coating film thickness is difficult. When the saponification degree is less than about 60%, obtaining sufficient water-solubility and water-developability is difficult.

The water-soluble copolymer of vinyl alcohol and another vinyl compound which can be used typically has an average polymerization degree of about from 200 to 5,000. Examples of the vinyl monomers to be copolymerized with vinyl alcohol include N-vinylpyrrolidone and acrylamide.

When such saponified products of polyvinyl acetate are reacted with the photosensitive compound represented by the above-described formula (III) in the presence of an acid catalyst to thereby obtain the photosensitive resin represented by the above-described formula (IV), an aldehyde or a ketone can simultaneously be reacted. Examples of aldehydes which can be used include aliphatic aldehydes such as formaldehyde, acetoaldehyde, propionaldehyde, butylaldehyde, and crotonaldehyde; aromatic aldehydes or their acetals such as benzaldehyde sulfonate, benzaldehyde di-sulfonate, sodium 4-azido-2-sulfobenzaldehyde, carboxybenzaldehyde, hydroxybenzaldehyde, and a formylstyrylpyridinium salt. Examples of ketones which can be used include acetone and methyl ethyl ketone.

The ratio of introduction of the photosensitive compound represented by formula (III) to a saponified product of polyvinyl acetate is preferably about from 0.3 to 5 mol % per unit.

The pattern formation method of the present invention comprises (a) a coating film formation step in which a photosensitive resin composition containing a photosensitive resin having a structural unit represented by the above-described formula (IV) is applied onto a substrate;

(b) an exposure step in which the coating film of the photosensitive composition is irradiated for a desired pattern; and (c) a development step in which the patternwise exposed coating film is developed with water or an aqueous developer to form a photo-cured pattern.

The above-described photosensitive resin composition can also contain a water-soluble polymer or a water-soluble azide compound. The above-described substrate can be an inner face plate of a color cathode-ray tube.

The pattern formation method can further comprise, after the above-described development step, steps of applying a graphite slurry onto the entirety of the above-described photo-cured pattern, drying to form a graphite coating film, and removing the above-described photo-cured pattern by use of a remover to form a black matrix.

Alternatively, the above-described photosensitive resin composition can further contain a phosphor, and a phosphor pattern can be formed through the above-described development step.

The above-described photosensitive resin composition can further contain a pigment, and a color filter can be formed through the above-described development step.

The pattern formation method of the present invention is performed by use of a photosensitive resin composition containing a photosensitive resin represented by the above-described formula (IV).

As described above, the photosensitive resin can be used together with a water-soluble polymer. Examples of the polymer include a saponified product of polyvinyl acetate, a polymer of natural product such as gelatin, a cellulose derivative, or casein, and a polymer or a copolymer comprising a water-soluble vinyl monomer. Examples of the water-soluble vinyl monomer which can be used include N-vinylformamide, N-vinylacetamide, vinylpyrrolidone, acrylamide, diacetoneacrylamide, N,N-dimethylacrylamide, vinylpyridine, methacrylamide and allylthiourea. The content of the resin represented by formula (1) in relation to the total amount of water-soluble polymer is preferably at least about 0.5%.

As described above, the photosensitive resin can be used in combination with a water-soluble azide compound. Examples of the water-soluble azide compounds include 4,4'-diazidostilbene-2,2'-disulfonic acid, 4,4'-diazidobenzalacetophenone-2-sulfonic acid, 4,4'-diazidostilbene-α-carboxylic acid, and salts thereof such as alkali metal salts, ammonium salts, and organic amine salts. Furthermore, it is preferable to use water-soluble azide compounds described in Japanese Patent Application Laid-Open (kokai) Nos. 49-102404, 50-141403, 2-204750, 4-26849, 5-11442, 5-113661 and 6-239930.

Additives such as ethylene glycol, sorbitol, and surfactants can optionally be added to the photosensitive resin composition used in the present invention to improve the coatability and moisture-retention property thereof. A silane coupling agent which serves as an adhesion-accelerator can optionally be added to the photosensitive resin composition used in the present invention in order to improve adhesion to a substrate. Examples of the adhesion-accelerators which can be used include N-β(aminoethyl)-aminopropylmethyldimethoxysilane and N-β(aminoethyl)-γ-aminopropyltrimethoxysilane.

Additives such as a preservative, a defoaming agent, or a pH-adjusting agent can optionally be added to the photosensitive resin composition used in the present invention.

Hydrophobic polymer emulsions can optionally be added to the photosensitive resin composition to improve the film strength, water resistance, and adhesion to a variety of substrates. Examples of the hydrophobic emulsions include a polyvinyl acetate emulsion, a polyacrylic acid emulsion and a urethane emulsion. A pattern formation method by use of a composition containing the hydrophobic polymer emulsion is suitably employed for a screen printing plate.

Further, colorants such as a pigment or a dye can be added to the photosensitive resin composition used in the present invention in order to prevent halation induced by exposure and to obtain a colored image.

Particularly, the colored image obtained through dispersing a pigment in the photosensitive resin composition can be applied to a color filter for a liquid crystal display, a color cathode-ray tube, and a plasma display; a color proof for printing; a secondary original image for printing.

The pattern formation method by use of the photosensitive resin composition as described above comprises, for example, forming a coating film in which a photosensitive resin composition is applied onto a substrate; an exposing the resulting photosensitive composition coating film by irradiating in a desired pattern; and then developing step the patternwise exposed photosensitive composition coating film with water or an aqueous developer to form a photo-cured pattern.

Examples of the above-described substrate include an inner face plate of a color cathode-ray tube. Consequently, a black matrix of a color cathode-ray tube, a phosphor pattern, a color filter and others can be specifically formed.

The pattern formation method of the present invention will next be described in detail.

(1) Forming a coating film of the photosensitive composition on a substrate.

A wide variety of substrates can be used in the present invention, including any substrate to which the photosensitive composition of the present invention can adhere. Examples of substrates which can be used include glass such as, $SiO_2$-treated glass, or ITO-coated glass; plastic films and sheets such as polyester films, polyamide films, polyvinyl chloride films, and polypropylene films; metal substrates; metal-laminated plastic sheets and films; mesh; and silicon wafers.

Coating methods which can be used for the photosensitive composition of the present invention include spin coating, roll-coater coating, curtain coating, and applicator coating, which have conventionally been employed. The coated film is subsequently dried through a customary method at a specific temperature, to thereby obtain a coating film.

(2) Pattern exposure step.

Any customary light source can be used for the exposure of the above-described coating film of the photosensitive composition so long as it emits light having a wavelength at which the photosensitive resin of formula (1) used in the present invention can be sensitized. Examples include an ultra-high-pressure mercury lamp, a high-pressure mercury lamp, a xenon lamp, a metal halide lamp, and a chemical lamp. Also, there can be employed any customary exposure method such as the magnification- or reduction-projection exposure method, the contact exposure method, or the proximity exposure method.

(3) Development step.

The above-described patternwise irradiated coating film of the photosensitive composition can be developed by use of water, a mixture solvent of a water-aqueous solvent, or an aqueous solution containing an acid, an alkali, a pH-adjusting agent, a surfactant and others. Examples of the development methods include spray-development, dipping-development, paddle-development, etc., which are customary methods.

As described above, the pattern formation method of the present invention is particularly advantageously applied to an inner face plate of a color cathode-ray tube. Application of the above-described pattern formation method to the above-described inner face plate of a color cathode-ray tube assures high sensitivity and high resolution, and therefore high productivity is realized.

For example, in the case in which a black matrix of a color cathode-ray tube is formed, graphite is applied onto the above-described formed pattern and the coated pattern is etched with a remover. In this case, a fine black matrix is obtained due to good etchability of the pattern formed in accordance with the present invention.

Removers which can be used include aqueous solutions of acidic compounds such as periodic acid or hydrogen peroxide; acids such as sulfuric acid, sulfamic acid, nitric acid, or dodecylbenzenesulfonic acid; and mixtures thereof.

In the case of formation of a phosphor pattern, the photosensitive composition of the present invention containing a phosphor is homogeneously applied onto a substrate on which the phosphor pattern is formed, e.g., the above-described black matrix in the inner face plate of a color cathode-ray tube, and dried. The coated composition is exposed to a UV beam through a specifically patterned mask, and then developed with water to exclusively leave the exposed parts. When three different phosphors of red (R), green (G), and blue (B) are employed, the above-mentioned steps are performed three times to thereby complete the phosphor face.

In the case of formation of a color filter of a color cathode-ray tube, the photosensitive composition of the present invention containing, for example, a pigment, is homogeneously applied onto a substrate on which the color filter is formed, i.e., the black matrix-equipped inner face plate of a color cathode-ray tube, and dried. The coated composition is exposed to a UV beam through a specifically patterned mask, and then developed with water so that the exposed parts alone remain. When three different inorganic pigments of red (R), green (G), and blue (B) are used, the above-described steps are performed three times to thereby obtain a complete color filter.

The present invention will next be described in detail with reference to the examples.

PHOTOSENSITIVE RESIN MANUFACTURE EXAMPLE 1

(1) Preparation of aqueous dispersion of 3-(2',2'-dimethoxyethyl)rhodanine.

Aminoacetaldehyde dimethylacetal (53 g) and sodium hydroxide (20 g) were dispersed and dissolved in water (200 g), and the mixture was cooled to 10° C. Carbon disulfide (38 g) was added dropwise over 30 minutes with stirring, followed by a reaction at 20° C. for 24 hours. Subsequently, ethyl chloroacetate (81 g) was added dropwise over 15 minutes, and the resultant mixture was allowed to react at room temperature for 24 hours, to thereby obtain an aqueous dispersion of the target compound of the following formula.

(2) Synthesis of 5-(sodium 4'-azido-2'-sulfobenzylidene)-3-(2",2"-dimethoxyethyl)rhodanine.

Sodium 4-azido-2-sulfobenzaldehyde (120 g) and sodium hydroxide (30 g) were dissolved in water (2500 g). The mixture was cooled to 10° C. and added slowly to the aqueous dispersion obtained in step (1). As the reaction proceeded, the target substance precipitated. Reaction was allowed to proceed for 24 hours with continued stirring. NaCl (150 g) was added to the reaction mixture, and stirring was continued for an additional 5 hours. The target substance was collected by filtration and washed with acetone.

The product, which is represented by the following formula, had a purity of 95% as determined by liquid chromatography and an absorption peak of 388 nm.

(3) Synthesis of Photosensitive Resin.

Polyvinyl alcohol (100 g) (GH-17, manufactured by Nippon Synthetic Chemical Industry Co., Ltd.) was dissolved in water (900 g). The compound (13 g) obtained in step (2) and phosphoric acid (3 g) were added to the mixture, followed by reaction at 80° C. for 24 hours. The acetalization ratio was 90%. The reaction mixture was treated with an ion exchange resin to remove the phosphoric acid so as to prepare photosensitive liquid having photosensitive group introduced in an amount of 1.3 mol % with respect to PVA. Thereafter, ion-exchanged water was added to the photosensitive liquid to thereby adjust the solid content to 6%.

PHOTOSENSITIVE RESIN MANUFACTURE EXAMPLE 2

(1) Preparation of aqueous dispersion of 3-(4',4'-dimethoxybuthyl)rhodanine.

Aminobutylaldehyde dimethylacetal (67 g) and ammonia water (60 g) were dissolved in water (200 g), and the mixture was cooled to 10° C. Carbon disulfide (38 g) was added dropwise to the mixture over 30 minutes with stirring, followed by a reaction at 20° C. for 24 hours. Next, ethyl chloroacetate (81 g) was added dropwise over 15 minutes, and the resultant mixture was allowed to react at room temperature for 24 hours, to thereby obtain an aqueous dispersion of the target compound of the following formula.

(2) Synthesis of 5-(sodium 4',-azido-2'-sulfobenzylidene)-3-(4",4"-dimethoxyethyl)rhodanine.

Sodium 4-azido-2-sulfobenzaldehyde (120 g) and sodium hydroxide (30 g) were dissolved in water (2,500 g). The mixture was cooled to 10° C. and added slowly to the aqueous dispersion obtained in step (1). As the reaction proceeded, the target substance precipitated. Reaction was allowed to proceed for 24 hours with continued stirring. NaCl (150 g) was added to the reaction mixture, and stirring was continued for an additional 5 hours. The target substance was collected by filtration and washed with acetone.

The product, which is represented by the following formula, had a purity of 95% as determined by liquid chromatography, and an absorption peak of 388 nm.

(3) Synthesis of Photosensitive Resin.

Polyvinyl alcohol (100 g)(GH-17, manufactured by Nippon Synthetic Chemical Industry Co., Ltd.) was dissolved in water (900 g). The compound (15 g) obtained in step (2) and phosphoric acid (3 g) were added to the mixture, followed by reaction at 60° C. for 24 hours. The acetalization ratio was 90%. The reaction mixture was treated with an ion exchange resin to remove the phosphoric acid so as to prepare photosensitive liquid having a photosensitive group introduced in an amount of 1.3 mol % with respect to PVA. Thereafter, ion-exchanged water was added to the photosensitive liquid, to thereby adjust the solid content to 6%.

PHOTOSENSITIVE RESIN MANUFACTURE EXAMPLE 3

Polyvinyl alcohol (100 g) (EG-05, manufactured by Nippon Synthetic Chemical Industry Co., Ltd.) was dissolved in water (1,800 g). The aforementioned compound obtained in step (2) (103 g) of the Photosensitive Resin Manufacture Example 2 and phosphoric acid (5 g) were added to the mixture, followed by reaction at 60° C. for 24 hours. The reaction mixture was treated with an ion exchange resin to remove the phosphoric acid so as to prepare photosensitive liquid having a photosensitive group introduced in an amount of 10.0 mol % with respect to PVA. Thereafter, ion-exchanged water was added to the photosensitive liquid to thereby adjust the solid content to 6%.

TEST EXAMPLE 1

The photosensitive liquid of Photosensitive Resin Manufacture Example 1 was diluted to 5%. The liquid was applied to a glass plate to form a photosensitive film having a film thickness of 1.0 μm. The photosensitive film was exposed to light of an ultra-high pressure mercury lamp (ultraviolet illuminance: 5.0 mW/cm$^2$, UV-35 (an illuminance meter manufactured by ORC) in an amount of 1 mJ. After exposure, the photosensitive film was developed with water, confirming that a 50 μm-wide line was clearly resolved.

TEST EXAMPLE 2

The photosensitive liquid of Photosensitive Resin Manufacture Example 2 was diluted to 5%. The liquid was coated on a glass plate to form a photosensitive film having a film thickness of 1.0 μm. The photosensitive film was exposed an ultra-high pressure mercury lamp (ultraviolet illuminance: 5.0 mW/cm$^2$, UV-35 (an illuminance meter manufactured by ORC) in an amount of 1 mJ. After exposure, the photosensitive film was developed with water, confirming that a 50 μm-wide line was clearly resolved.

EXAMPLE 1

Sensitivity Curve

Sensitivity curves of the following typical photosensitive liquids were obtained follows.

Photosensitive Liquid A: Photosensitive liquid prepared in Manufacture Example 1 (solid content: 6%).

Photosensitive Liquid B: Photosensitive liquid prepared in Manufacture Example 1 (solid content: 6%): 80 g.

6% aqueous polyvinylpyrrolidone solution: 18.2 g.

6% aqueous DAS solution: 1.8 g.

Figure 1:
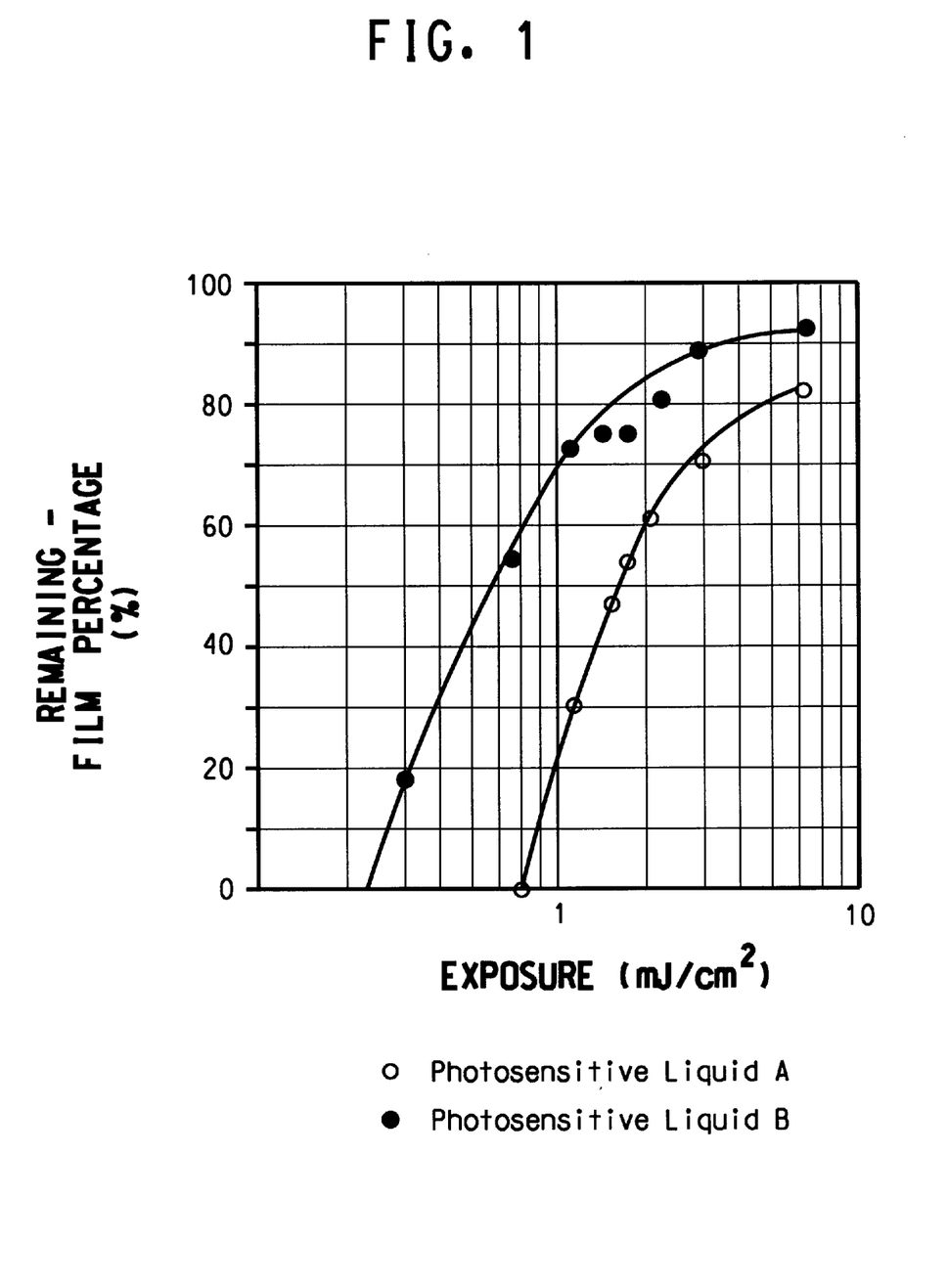
FIG. 1 is a graph showing the results of a test conducted on compounds prepared in Examples.

Each of Photosensitive Liquids A and B was coated on a glass plate having an area of 25 cm$^2$, and dried at 60° C. for 5 minutes, to thereby obtain photosensitive films having a film thickness of 1 μm. The photosensitive films were exposed to an ultra-high pressure mercury lamp, at an intensity of illuminance of 0.15 mW/CM$^2$ (at 350 nm) for 2 to 50 seconds. After exposure, the photosensitive films were developed with water and dried. The thickness of the cured films were measured, and remaining-film percentage was calculated. The results are shown in the table below and the graph.

TABLE 1

| Exposure time (sec) | Amount of exposure (mJ/cm$^2$) | Residual film percentage of photosensitive liquid A | Residual film percentage of photosensitive liquid B |
|---|---|---|---|
| 2 | 0.3 | 0 | 17 |
| 5 | 0.75 | 0 | 54 |
| 8 | 1.20 | 31 | 72 |
| 10 | 1.50 | 46 | 75 |
| 12 | 1.80 | 54 | 75 |
| 15 | 2.25 | 61 | 80 |
| 20 | 3.00 | 69 | 88 |
| 50 | 7.50 | 82 | 91 |

A photosensitive film having a film thickness of 1 μm obtained from Photosensitive Liquid A, was patternwise exposed to light of an ultra-high pressure mercury lamp (intensity of illuminance: 5.0 mW/cm$^2$ at 350 nm) through a chromium mask for 2 seconds and developed with water, to thereby form a fine pattern.

EXAMPLE 2

A 6% photosensitive liquid (20 g) obtained in the above-described Manufacture Example 1, an aqueous polyvinylpyrrolidone solution (100 g, solid content: 6%), and 6% aqueous solution of sodium 4,4'-diazidostilbene-2,2'-disulfonate (hereinafter referred to as DAS) (10 g) were mixed together. The mixture was diluted to 3% and filtered through a membrane filter having a pore size of 1.0 μm.

The photosensitive liquid was spin coated on the inner face plate of a color cathode-ray tube, to thereby form a coating having a film thickness of 0.5 μm. The coating was dried at 50° C. for 5 minutes, to thereby obtain a coating film.

Next, the coating film was exposed through a shadow mask to light of an ultra-high pressure mercury lamp at an intensity of illuminance of 0.10 mW/cm$^2$ at 350 nm) for 12 seconds.

After exposure, the coating film was developed with water at 40° C. for 30 seconds to thereby obtain pattern dots exhibiting excellent shape.

The photosensitive resin composition as described above showed reciprocity.

Next, carbon suspension was applied onto the dots. The dots and carbon thereon were removed by a remover to thereby form a clear black matrix.

EXAMPLE 3

The procedure of Example 2 was repeated except that the photosensitive liquid obtained in Manufacture Example 2 was used instead of the photosensitive liquid obtained in Manufacture Example 1 to thereby form a black matrix.

EXAMPLE 4

A 6% photosensitive liquid (30 g) obtained in Manufacture Example 1, an aqueous polyvinylpyrrolidone solution (100 g, solid content: 6%), and a 6% aqueous DAS solution (10 g) were mixed together. KBM-603 (0.07 g) (a silane coupling agent manufactured by Shin-Etsu Chemical Co., Ltd.) was further added to the mixture. The mixture was diluted to 3% and filtered through a membrane filter having a pore size of 1.0 μm to thereby prepare a photosensitive liquid.

Through use of this photosensitive liquid, a clear black matrix was formed by the same method as used in Example 2.

EXAMPLE 5

A 6% photosensitive liquid (30 g) obtained in Manufacture Example 1 and an aqueous polyvinylpyrrolidone solution (100 g, solid content: 6%) were mixed together. Further, to the mixture was added KBM-603 (0.05 g) (silane coupling agent manufactured by Shin-Etsu Chemical Co., Ltd.). The mixture was diluted to 3% and filtered through a membrane filter having a pore size of 1.0 μm, to thereby prepare a photosensitive liquid.

Through use of this photosensitive liquid, a clear black matrix was formed by the same method as used in Example 2.

EXAMPLE 6

A photosensitive composition having the following formulation was prepared.
10 wt. % aqueous solution of the photosensitive resin prepared in Manufacture Example (1): 70 g.
Red inorganic pigment (iron oxide, average particle size: 100 nm, manufactured by Ishihara Sangyo Kaisha, Ltd.): 28 g
Pure water: 280 g
Silane coupling agent (KBM-603): 0.14 g, 5%
Tamol 731 (a surfactant manufactured by Rohm & Haas Co.): 1.5 g The photosensitive composition as formulated above was spin-coated on a 10 cm-by-10 cm soda glass and dried, to thereby obtain a coating film having a film thickness of 1.0 μm. Subsequently, areas corresponding to red were exposed to light of an ultra-high pressure mercury lamp at an intensity of illuminance of 0.20 mW/CM$^2$ at 350 nm on the surface of the glass plate) for 30 seconds under the following conditions: a shadow mask with a pitch 0.28 mm; distance between the shadow mask and the glass plate=1 cm; and the distance between the shadow mask and the ultra-high pressure mercury lamp=30 cm.

Subsequently, the coating film was developed with warm water sprayed by means of a sprayer (nozzle: No. 3 manufactured by Spraying System, water pressure: 2.0 kg/cm$^2$, temperature: 40° C., distance: 15 cm).

The resulting pattern was observed under a microscope, showing a faithful pattern of the red pigment film on the shadow mask.

EXAMPLE 7

The inner face plate of the color cathode-ray tube on which a black matrix was formed by the method used in Example 2 was coated with a 0.1% aqueous polyvinyl alcohol solution and dried. The plate was coated with phosphor slurry having the following formulation and dried, to thereby obtain a coating film having a film thickness of 10 to 12 μm. Next, through use of a 0.28-pitch shadow mask, the coating film was exposed for 25 seconds to light of an ultra-high pressure mercury lamp, at the intensity of illuminance of 0.12 mW/cm$^2$ at 350 nm. After exposure, the coating film was developed with water at 40° C. for 30 seconds, to thereby form a pattern of phosphor fully charged with a green phosphor.
(Composition of slurry containing a phosphor)
Green fluorescent substance: 100 g
Photosensitive liquid prepared in Manufacture Example 1 (solid content: 2.5%): 285 g
10% aqueous solution of LT-221 (a surfactant manufactured by NOF): 4.6 g
10% aqueous solution of L-62 (a surfactant manufactured by BASF): 1.8 g

EXAMPLE 8

The inner face plate of the color cathode-ray tube on which a black matrix had been formed by the method used in Example 2 was coated with a 0.1% aqueous polyvinyl alcohol solution and dried. The plate was coated with phosphor-containing slurry having the following formulation, dried. A pattern of fluorescent by the same method used in Example 6 above was formed
(Composition of slurry containing a phosphor)
Green phosphor: 100 g
Photosensitive liquid prepared in Manufacture Example 1 (solid content: 2.5%): 44 g 2.5% aqueous poly(N-vinylformamide) solution: 219 g
2.5% aqueous DAS solution: 22 g
10% aqueous solution of LT-221 (a surfactant manufactured by NOF): 4.6 g
10% aqueous solution of L-62 (a surfactant manufactured by BASF): 1.8 g

We claim:

1. A photosensitive compound comprising at least one unit represented by the following formula:

wherein Q is an organic moiety and Ar is selected from at least one of the following group (II):

wherein X is selected from at least one of lithium, sodium, potassium, ammonium, monoalkylammonium, dialkylammonium, trialkylammonium and tetraalkylammonium.

2. A photosensitive compound of claim 1 wherein Q is represented by the following formula:

wherein R is selected from alkyl groups of 1 to 6 carbon atoms and groups of the formula —$(CH_2)_M$— (wherein m is 2 or 3) formed of two R's joined to each other; and n is 1, 2, or 3.

3. A photosensitive compound of claim 1 wherein Q is a structural unit represented by the following formula:

wherein n is 1, 2 or 3.

4. A photosensitive resin comprising a unit represented by the following formula:

wherein $Q_1$ is an organic moiety and; wherein n is 1, 2, or 3; Ar is selected from the following:

and X is at least one of lithium, sodium, potassium, ammonium, monoalkylammonium, dialkylammonium, trialkylammonium, or tetraalkylammonium.

5. A photosensitive resin of claim 4, wherein $Q_1$ is a structural unit represented by the following formula:

wherein n is 1, 2 or 3.

6. A photosensitive resin of claim 4 wherein $Q_1$ is represented by the following fomula:

wherein R is selected from alkyl groups of 1 to 6 carbon atoms and groups of the formula —$(CH_2)_M$— (wherein m is 2 or 3) formed of two R's joined to each other; and n is 1, 2, or 3.

7. A photosensitive composition containing a photosensitive compound of claim 2.

8. A photosensitive composition containing a photosensitive compound of claim 3.

9. A method for the manufacture of a photosensitive compound containing an azide group, comprising bringing together, under reaction conditions:

wherein Rz represents hydrogen or a substituent and Ar is selected from the following:

wherein X is selected from at least one of the group consisting of lithium, sodium, potassium, ammonium, monoalkylammonium, dialkylammonium, trialkylammonium and tetraalkylammonium.

10. A method for the manufacture of a photosensitive compound of claim 9 wherein Rz is a substituent having an acetal group.

11. A method for the manufacture of a photosensitive resin containing an azide group, comprising bringing together, under reaction conditions:

+ wherein Rz represents hydrogen or a substituent and Ar is selected from at least one wherein X is at least one of lithium, sodium, potassium, ammonium, monoalkylammonium, dialkylammonium, trialkylammonium and tetraalkylammonium.

12. A method of claim 11 wherein Rz is a substituent having an acetal group, and the method further comprises a step of transforming the acetal group into a saponified product of polyvinyl acetate.

13. A pattern formation method comprising (a) applying a photosensitive resin composition onto a substrate to thereby form a coating film of the photosensitive composition; (b) irradiating the resulting coating film of the photosensitive composition with a desired pattern; and (c) developing the resulting patternwise exposed coating film with water or an aqueous developer to form a photo-cured pattern, the photosensitive resin compositions containing a photosensitive resin of claim 4.

14. A pattern formation method of claim 13 wherein the photosensitive resin composition further contains a water-soluble polymer.

15. A pattern formation method of claim 13 wherein the photosensitive resin composition further contains a water-soluble azide compound.

16. A pattern formation method of claim 13 wherein the substrate is an inner face plate of a color cathode-ray tube.

17. A pattern formation method of claim 13 further comprising, after developing step (c), applying a graphite slurry onto the entirety of the photocured pattern and drying to form a graphite coating film, and removing the photocured pattern by use of a remover to form a black matrix.

18. A pattern formation method of claim 13 wherein the photosensitive resin composition further contains a phosphor capable of forming a phosphor pattern in the developing step.

19. A pattern formation method of claim 13 wherein the photosensitive resin composition further contains a pigment, and a color filter is formed in the developing step.

* * * * *